(12) United States Patent
Koo et al.

(10) Patent No.: US 8,795,775 B2
(45) Date of Patent: Aug. 5, 2014

(54) NANOIMPRINT METHOD

(75) Inventors: Namil Koo, Aachen (DE); Jung Wuk Kim, Aachen (DE); Christian Moormann, Aachen (DE)

(73) Assignee: AMO GmbH, Aachen (DE)

( * ) Notice: Subject to any disclaimer, the term of this patent is extended or adjusted under 35 U.S.C. 154(b) by 244 days.

(21) Appl. No.: 13/035,602

(22) Filed: Feb. 25, 2011

(65) Prior Publication Data

US 2011/0171432 A1    Jul. 14, 2011

Related U.S. Application Data

(63) Continuation of application No. PCT/EP2009/061005, filed on Aug. 26, 2009.

(30) Foreign Application Priority Data

Aug. 27, 2008  (DE) .......................... 10 2008 041 623

(51) Int. Cl.
 *B05D 3/00* (2006.01)
(52) U.S. Cl.
 USPC ........................................................ 427/264
(58) Field of Classification Search
 CPC ..... B81C 1/0046; B81C 1/00468; B05D 3/12
 USPC ........................................................ 427/264
 See application file for complete search history.

(56) References Cited

U.S. PATENT DOCUMENTS 5,116,548 A * 5/1992 Mallik et al. ................. 264/1.34
5,259,926 A * 11/1993 Kuwabara et al. ............... 216/54
5,330,799 A * 7/1994 Sandor et al. ................. 427/510
5,425,848 A * 6/1995 Haisma et al. .................. 216/48
6,180,239 B1 1/2001 Whitesides et al.

(Continued)

FOREIGN PATENT DOCUMENTS

EP    1473594    11/2004
EP    1972997    9/2008

(Continued)

OTHER PUBLICATIONS

Rollerwall.pdf; Rollerwall The UnWallpaper Company, Jan. 20, 2007; found at http://web.archive.org/web/20070120033141/http://rollerwall.com/howitworks.html.*

(Continued)

*Primary Examiner* — Michael Wieczorek
*Assistant Examiner* — James M Mellott
(74) *Attorney, Agent, or Firm* — McCarter & English LLP

(57) ABSTRACT

A method for applying a patterned coating of resist onto a surface of a substrate, includes embossing flowable resist at least once, wherein the flowable resist is respectively embossed between a patterned surface of a stamp and a carrier, whereby the stamp surface is provided with a patterned resist surface. The stamp carrying a first patterned part of the resist coating and the carrier carrying a second part of the resist coating are separated from each other. The patterned resist coating is transferred, wherein the first patterned part of the resist coating on the surface of the stamp is pressed against the surface of the substrate and the patterned resist coating is transferred onto the surface of the substrate. The first patterned part of the resist coating is cured and a demolding step is performed by separating the stamp from the first patterned part of the resist coating.

20 Claims, 2 Drawing Sheets

(56) References Cited

U.S. PATENT DOCUMENTS

| | | | |
|---|---|---|---|
| 6,375,870 B1* | 4/2002 | Visovsky et al. | 264/1.31 |
| 2002/0182434 A1* | 12/2002 | Yamamoto et al. | 428/621 |
| 2003/0072079 A1* | 4/2003 | Silverstein et al. | 359/486 |
| 2003/0189273 A1* | 10/2003 | Olsson | 264/293 |
| 2004/0149683 A1 | 8/2004 | Baek et al. | |
| 2004/0231781 A1 | 11/2004 | Bao et al. | |
| 2006/0006580 A1* | 1/2006 | Olsson et al. | 264/293 |
| 2006/0183395 A1* | 8/2006 | Xu et al. | 445/50 |
| 2008/0000375 A1* | 1/2008 | Nielsen et al. | 101/450.1 |
| 2008/0191372 A1* | 8/2008 | Takaoka | 264/39 |

FOREIGN PATENT DOCUMENTS

| | | |
|---|---|---|
| WO | WO 2006062930 | 6/2006 |
| WO | WO 2008124180 | 10/2008 |
| WO | WO 2008156750 | 12/2008 |

OTHER PUBLICATIONS

"Roller Nanoimprint lithography," Tan Hua et al: Journal of Vacuum Science & Technology B: Microelectronicsprocessing and Phenomena, American Vacuum Society, New York, NY, US. Bd. 16, Nr. 6 (Nov. 1, 1998), Seiten 3926-3928, XP012007312; ISSN: 0734-211X Abbildung 2.

* cited by examiner

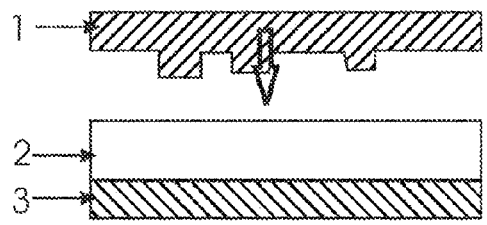
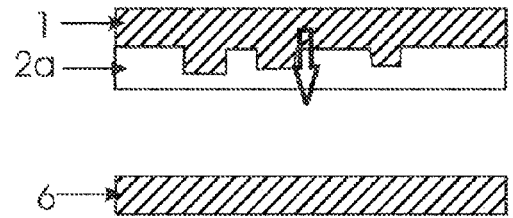
Fig. 1      Fig. 4
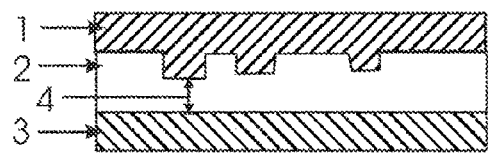
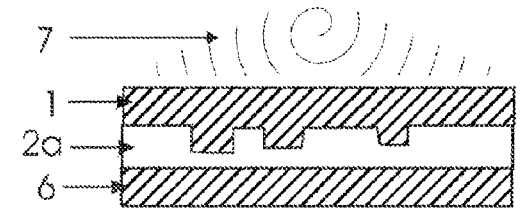
Fig. 2      Fig. 5
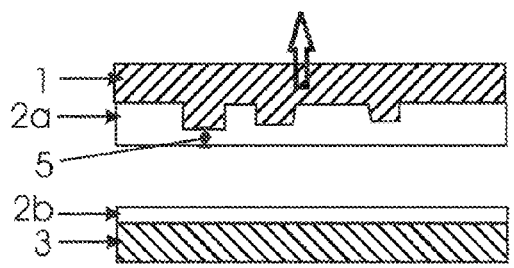
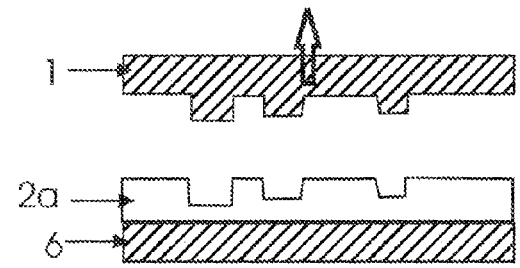
Fig. 3      Fig. 6

NANOIMPRINT METHOD

CROSS-REFERENCE TO RELATED APPLICATIONS

This application is a continuation of International Patent Application No. PCT/EP2009/061005, filed Aug. 26, 2009 and claims priority to German Application No. DE 10 2008 041 623, filed Aug. 27, 2008, the contents of both are hereby incorporated by reference in their entirety as part of the present disclosure.

FIELD OF THE INVENTION

The present invention relates to a method and an assembly for generating a micro or nanopattern on a substrate and more specifically by generating the pattern by embossing and transferring onto a substrate.

BACKGROUND OF THE INVENTION

The demand for the quick, economic and reproducible production of patterns on the nano or micro scale is one of the primary motivations in the development of nanotechnology.

The so-called nanoimprint, a recent lithography technology for fabricating nanoscale patterns in the field of nanoelectronics, photonics and biotechnology is a cost-effective method. The basic idea is the replication of patterns applied on, for example etched into, a stamp, by pressing this patterned stamp surface into a curable, flowable low-viscosity resist on a substrate surface, i.e. by means of simultaneous embossing of the resist and applying (imprinting) the substrate. After filling all cavities of the patterned stamp surface with the resist, the lacquer layer is cured by means of heat and/or ultraviolet light. In the final step, the stamp is removed and a three-dimensional replication of the pattern remains in the resist coating on the substrate. The nanopattern can then be transferred into a substrate by further etching. The method is described, for example, in 2007059497 A1.

Different methods are known for applying the resist coating which is yet to be embossed onto the stamp surface or onto the substrate. In the above-mentioned US 2007059497 A1, this is accomplished by the resist being applied onto the patterned stamp surface by means of rotation coating. U.S. Pat. No. 6,334,960 B1 describes the dispensing of resist lacquers onto the substrate in order then to emboss the resist surface on the substrate by means of the patterned stamp surface. The dispensing is comparatively time-consuming and the resist drop boundaries can lead to defects in the embossed resist after curing.

A roll-shaped stamp with a patterned roll surface, which rolls on the substrate provided with a resist coating in order to emboss the resist coating is known from U.S. Pat. No. 5,425,848 A1. The resist coating is cured almost simultaneously by UV irradiation in the area of the nip.

A method is known from WO 02/03142 A2 in which a polydimethylsiloxane stamp is wetted with an organic liquid in order to form self assembled monolayers (=SAMs) on its surface, and wherein the stamp with the SAMs is pressed onto the substrate in order to transfer the SAMs onto the substrate.

In the nanoimprint of the prior art, one is faced with two problems or aims, namely on the one hand, to achieve a uniform homogeneous filling of the patterned stamp surface, on the other hand, the residual resist thickness is supposed to be applied as thinly as possible, as will be explained below, in order not to delay of affect the subsequent etching treatment of the substrate.

These aims compete against each other; because the uniform filling is usually achieved with an excess amount of resist, there always remains an unpatterned residual resist thickness (thickness of the cured resist under the pattern), which may additionally have a layer thickness inhomogeneity. If the pattern of the stamp surface is not periodic but irregular, this inhomogeneity can become even greater because, when filling larger volumes of the pattern, more resist is consumed for filling than in smaller pattern volumes, so that lacquer deficiency and filling defects may arise. Though this homogeneity can be reduced, even if higher-viscosity lacquers are used, by using lacquer with a higher lacquer density, i.e. a thicker lacquer layer, for filling the pattern. However, the use of such a lacquer makes the subsequent etching process for transferring the pattern into the substrate as it is usually employed in the semiconductor industry more difficult.

Though a higher pressure during embossing can be used in order to reduce the inhomogeneity, this, however, does not work in the case of flexible stamps and moreover only provides for a minimal reduction of the residual resist thickness as a rule.

In order to increase homogeneity while simultaneously minimizing the residual resist thickness, it is known to carry out the coating process adapted to the pattern by locally adapting the density and size of the drops to the pattern during drop dispensing. This requires a precise analysis of the pattern and therefore is comparatively complex and time-consuming. The instrumentation setup is comparatively complicated and the above-mentioned problem of defects at the resist drop boundaries remains.

Therefore, the invention is based on the object of providing a method for applying a patterned coating of resist onto a substrate surface with a resist coating that is improved over the prior art in that it is more homogeneous and has a lower residual resist thickness, and that the method can be carried out easily, quickly and cost-effectively.

SUMMARY OF THE INVENTION

This object is achieved by a method for applying a patterned coating of resist onto a surface of a substrate, comprising: at least one embossing step, wherein flowable resist is respectively embossed between a patterned surface of a stamp and a carrier in order to provide the stamp surface with a patterned resist surface, a respectively subsequent separation step, wherein the stamp with a first part of the patterned resist coating and the carrier with a second part of the resist coating are separated from each other; a subsequent transfer step, wherein the first part of the patterned resist coating on the surface of the stamp is pressed against the surface of the substrate in order to transfer the patterned resist coating onto the surface of the substrate; a curing step, wherein the first part of the patterned resist coating is cured; a demolding step, wherein the stamp is separated from the first part of the patterned resist coating. Advantageous embodiments are in each case the subject matter of the dependent claims. It must be remarked that the features cited individually in the patent claims can be combined in any technologically meaningful manner and present other embodiments of the invention. The description, in particular in connection with the figures, additionally characterizes and specifies the invention.

In some embodiments, the invention relates to a method for applying a patterned coating of resist onto a substrate surface. The method comprises at least one embossing step, wherein flowable resist is respectively embossed between a patterned surface of a stamp and a carrier in order to provide the flowable resist with a patterned surface corresponding to the stamp surface. The method comprises one subsequent separation step, respectively, wherein the stamp with the patterned resist coating consisting of the resist that has not yet hardened and the carrier are separated. By separating the stamp with a first part of the patterned resist coating and the carriers with a second part of the resist coating, the resist coating adjacent to the stamp surface is divided into two parts along a cutting line parallel to the stamp surface, wherein the residual resist thickness of the resist coating present on the stamp surface after the separation step is reduced, for example, approximately halved.

The embossing step and the associated separation step are preferably carried out repeatedly, depending on the intended reduction of the residual thickness of the resist coating, until the residual thickness of the first part of the resist coating located on the stamp has been successively reduced to the desired measure.

In some embodiments, the method according to the invention includes a subsequent transfer step wherein the patterned resist coating on the stamp surface, i.e. the first part, is pressed against the substrate surface in order to transfer the patterned resist coating onto the substrate surface, and a curing step, wherein the first part of the patterned resist coating disposed on the substrate surface is cured. Thereafter, or overlapping in time, a demolding step takes place wherein the stamp is separated from a first part of the patterned resist coating located on the substrate.

The invention is not limited with regard to the process parameters, such as pressure and temperature, and they will be selected in accordance with the materials selected for the resist, the substrate or the carrier; in one embodiment, at least the embossing step and the transfer step take place under vacuum. Preferably, the steps take place in an environment with a concentration of airborne particles prescribed in ISO-14644-1 (clean-room conditions). The temperature is, for example, in the range of from approximately 30° C. to approximately 90° C. above the glass transition temperature of the resist.

The embossing step and the transfer step thus serve for transferring the height and width information of the stamp surface pattern onto the resist coating which is finally located on the substrate.

In some embodiments, the method according to the invention is characterized by the preceding sequence(s) comprised of the embossing and the separation step, whereby the layer thickness of the resist coating to be transferred onto the substrate and in particular the residual thickness, i.e. the thickness of the resist coating exceeding the pattern depth, can be reduced and a homogeneous filling of the stamp pattern is achieved at the same time. Since the steps of embossing or filling the stamp pattern, the reduction of the layer thickness by separation and the transfer onto the substrate are carried out uncoupled, they can be more easily and in each case separately optimized with regard to filling, thin residual layer, homogenization of the residual layer and filling and good resolution in the reproduction of the pattern, for example by the process conditions, such as pressure, temperature, time and/or the surface properties of the carrier on the one hand, and of the substrate on the other hand, being separately set in each step. The use of mechanical devices, such as a knife or a doctor blade, for the partial removal of the coating is not required. The possibility of them damaging the coating or even the stamp surface is excluded in the method according to the invention.

In at least some embodiments, the stamp can be coated with the resist; preferably, however, the carrier is coated with the flowable resist in a coating step preceding the embossing step. Since the carrier has a generally smooth surface without any patterning, a homogeneous distribution is easier to achieve on the carrier than on the patterned stamp surface. In the coating step, the carrier is preferably coated with the flowable resist by means of the spin coating process. A homogeneous distribution of the flowable resist is thus accomplished quickly and efficiently.

In order to improve the filling of the pattern, the carrier according to one embodiment of the method according to the invention, compared to the substrate has a surface-active, for example adhesion-reducing, coating or is made from an appropriate material.

In another preferred embodiment, the first part of the resist coating located on the stamp, after the separation step, is wetted with a solvent that is active with regard to the resist, in order to increase the adhesiveness on the substrate during the later transfer onto its surface and to lower the viscosity of the resist, thus improving the uniformity of the distribution of the resist on the stamp surface. The solvent, for example toluene, xylol tetrahydrofuran, can provide for a uniform resist coating, particularly on a stamp surface coated with a surface-active substance.

According to another advantageous embodiment of the method according to the invention, after the separation step, the stamp is spun with the first part of the patterned resist coating in a spinning step in order to thus accomplish an even more homogeneous distribution. Preferably, the spinning step takes place in combination with a preceding wetting of the resist with the above-mentioned solvent.

The resist can be such that curing takes place thermally, i.e. by an increase in temperature. Preferably, this is a resist which cures under ultraviolet light, with the resist then being cured by means of ultraviolet light in the curing step.

According to another advantageous embodiment, the curing step and the transfer step are carried out simultaneously or overlapping in time. Since the bond to the substrate is higher during curing, it is possible to transfer the coating from the stamp onto the substrate without leaving any residue, and also to monitor the shape of the transferred pattern in all three dimensions.

Preferably, the pattern of the patterned stamp surface is a micro to nanopattern. Nanopattern within the sense of the invention is a pattern with a lateral resolution of up to some nm.

The substrate material is preferably selected from the group consisting of at least one semiconductor, such as silicon, GaAs, InP, at least one dielectric, such as quartz glass, and at least one metal and combinations thereof. The substrate is, for example, a polished silicon wafer. The invention, however, is not limited to hard and flat substrates, but the method according to the invention is also suitable for coating flexible polyimide films as substrates.

The term resist within the sense of the invention is to be interpreted broadly, and it generally is a lacquer-like, flowable substance which after curing forms a mask applied onto the substrate which provides for a locally varying cover, so that patterns are incorporated, corresponding to the masking by means of the mask, into the surface of the substrate during its later processing. The pattern, more specifically the depth of the pattern, will generally be selected such that the thickness of the mask resulting from the patterned resist coating is selected such that a required minimum durability of the resist coating is provided in the subsequent processing step (etching) of the substrate. Generally, compared with the stamp, the resist material is a relatively soft material which can be transferred from a flowable into a cured state and which contains polymers, such as thermoplastic polymers, prepolymers that are thermally curable by means of radiation (ultraviolet radiation), for example PMMA or monomers, preferably a purely organic monomer or an organic/inorganic composite monomer. For example, it is a methacrylate-based resist. Preferably, the viscosity of the flowable resist is less than 50 m Pa s.

The stamp of the method according to the invention can be hard and is formed, for example, from semiconductors, dielectrics, metals and combinations thereof. The pattern in its patterned surface has been applied, for example, by electron beam lithography and subsequent dry etching. In order to facilitate the separation of the stamp and the coated substrate in the demolding step, the stamp surface can be treated with surface active agents, such as 1H,1H,2H,2H-perfluorodecyltrichlorosilane.

Preferably, the stamp according to the invention is made from a flexible material. The transfer of a pattern onto a substrate with a non-plane surface is thus enabled. Furthermore, flexible stamps have a very low adhesion towards the resist and facilitate a very easy demolding after the resist has cured, so that a high throughput is achieved.

More preferably, the stamp is made from a polymer. A simple and cost-effective replication of the pattern from a "master" stamp is thus accomplished.

In one embodiment of the method according to the invention, the substrate surface, in several sequential steps, is successively coated with the patterned resist surface in several transfer steps (step and repeat). According to another advantageous embodiment, the carrier and/or the stamp are configured as a roll or conveyor belt in order to be able to carry out the associated steps of the method according to the invention continuously.

Preferably, the carrier and the stamp are configured as a roll or conveyor belt, and the at least one embossing step with the associated separation step, the pressing step and the demolding step are carried out in a continuous roll-after-roll process. For example, a large substrate surface can thus be coated quickly and effectively. Due to the embossing and the transfer of the resist coating being uncoupled, no pre-treatment of the substrate as in the prior art is required.

In another advantageous embodiment, opposite substrate surfaces of the substrate are simultaneously subjected to the transfer step. Due to the simultaneous coating of opposite substrate surfaces, the throughput can be increased as compared with a coating process that progresses over time.

In another advantageous embodiment, the substrate surface coated with the patterned resist surface is etched, for example anisotropically etched, in an etching step following the demolding step, in order to produce, for example, components for a micromechanic unit. Preferably, the method with the subsequent etching step is employed for producing a semiconductor pattern, for example nanoscale FinFet transistors with CMOS technology, wherein a doping step can optionally be carried out after the etching step.

The invention further relates to a device for carrying out the method in one of the embodiments described above and comprises at least one stamp and at least one carrier for embossing the resist coating on the at least one carrier and wherein the stamp serves for the subsequent transfer of the embossed resist coating onto the substrate.

These and other advantages of the present invention, and/or of the currently preferred embodiments thereof, will become more readily apparent in view of the following detailed description of currently preferred embodiments and the accompanying drawing

BRIEF DESCRIPTION OF THE DRAWINGS

The invention as well as the technical environment is explained in more detail with reference to the figures below, in which:

FIG. 1 the coating step of the method according to one embodiment of the present invention;

FIG. 2 the embossing step of the method according to one embodiment of the present invention;

FIG. 3 the separation step of the method according to one embodiment of the present invention;

FIG. 4 the transfer step of the method according to one embodiment of the present invention;

FIG. 5 the curing step of the method according to one embodiment of the present invention;

FIG. 6 the demolding step of the method according to one embodiment of the present invention.

DETAILED DESCRIPTION OF THE PREFERRED EMBODIMENTS

Figure 7:
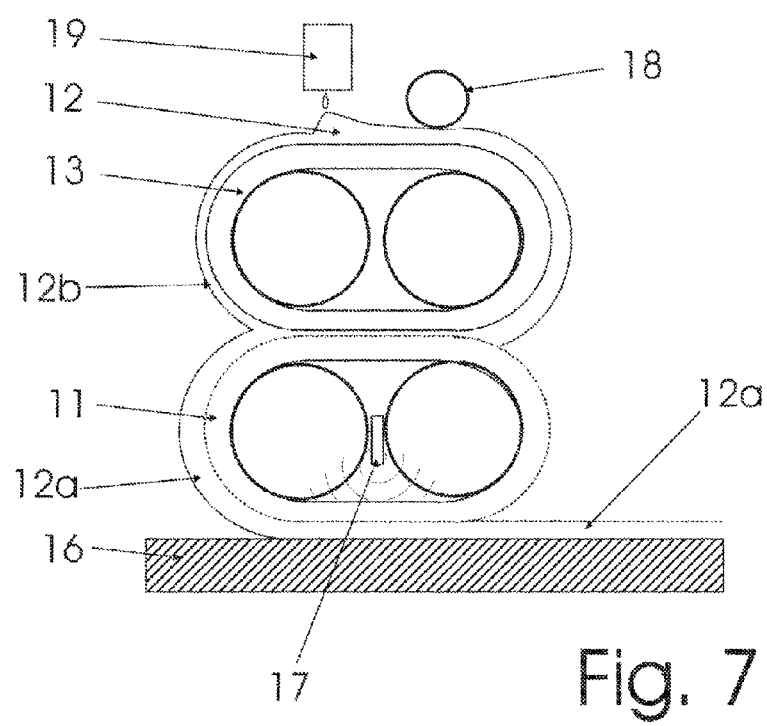
FIG. 7 a device for carrying out the method according to the invention in another embodiment.

FIG. 1 shows the coating of a carrier 3 with the flowable resist 2. A spinning method (not shown) can be used in the process. A flexible stamp 1 made from polymer is brought close, as is shown with the outlined arrow, in order to emboss, in the embossing step shown in FIG. 2, the resist layer 2 between the carrier 3 and the patterned surface of the stamp 1. A residual thickness 4 remains between the deepest embossed portion and the carrier 3.

In order to reduce the layer thickness of the resist coating 2 of the carrier, the stamp 1 is separated from the carrier 3 in the separation step shown in FIG. 3. In the process, a first patterned part of the resist coating 2a adheres to the stamp 1, while a second unpatterned part 2b remains on the carrier 3. Due to the separation step, the thickness and, in particular, the residual thickness 5 of the first part 2a located on the stamp 1 is reduced as compared to the state during the embossing step.

In FIG. 4, the first part 2a of the resist coating is transferred onto the substrate 6 by bringing the stamp 1 with the first part 2a of the resist coating close to a substrate 6 and pressing the part 2a onto its surface. As shown in FIG. 4, a curing step is carried out in which the first part 2a of the resist coating is cured by means of ultraviolet light irradiation 7.

For this purpose, for example, the stamp 1 can be made from a polymer that is transparent to ultraviolet light. In the subsequent demolding step shown in FIG. 6, the stamp 1 is removed from the first part 2 a of the cured resist coating, whereby the substrate 6 gets a patterned resist coating 2a which serves as a mask for a subsequent etching processing (not shown) in order to transfer the pattern into the surface of the substrate 6.

A device for carrying out the method according to the invention in another embodiment is shown in FIG. 7. This is a transfer process in which the stamp 11 and the carrier 13 are configured as a continuous conveyor belt respectively guided on and running around a roll pair. The flowable resist 12 is applied to the carrier conveyor belt 13 by means of a dispensing device 19 and the resist coating of the carrier 13 set to a constant thickness by means of an evener roll 18. On the opposite side of the carrier conveyor belt 13, the resist coating 12 is embossed by a stamp 11 which is configured as a conveyor belt and has an outlined patterned surface. In the run-out of the contact or embossing portion of the two conveyor belts, the resist coating 12 continues to adhere only partially on the stamp conveyor belt 11. A second part 12b is entrained with the carrier conveyor belt 13. In a contact portion of the conveyor belt, a first part 12*a* with the surface embossed by the patterned surface of the stamp 11 is transferred to a surface of the substrate 16 which is moved parallel to the stamp conveyor belt 11. At the same time, the resist coating is cured by means of UV irradiation by a UV lamp 17. For this purpose, the material of stamp conveyor belt 11 is made from flexible polymer material transparent to UV radiation. After curing, the first part 12*a* of the patterned resist coating adheres to the substrate 16 and the demolding of the stamp conveyor belt 11 in its run-out area takes place.

The method according to the invention can be carried out continuously with the above-described device. Nanopattern means a structure having a distance between neighboring pattern elements is between 1 and 999 nm. Micropattern means a structure having a distance between neighboring pattern elements is between 1 and 999 micrometer.

We claim:

1. A method for applying a patterned coating of resist onto a surface of a substrate, comprising the steps of:
    embossing a resist coating of flowable resist at least once, between a stamp having a patterned surface that is at least one of a micropattern and a nanopattern and a pattern between nanopattern and micropattern comprising recesses and a carrier so as to provide the patterned surface with a patterned resist coating wherein patterned resist extends into the recesses;
    separating the stamp carrying a first patterned part of the resist coating that forms a continuous layer on the patterned surface of the stamp and the carrier carrying a second part of the resist coating from each other, wherein at least one of (a) the carrier is planar and (b) the second part of the resist coating forms a continuous layer on the carrier after said separating;
    transferring the first patterned part of the resist coating onto a surface of a substrate by pressing the first patterned part of the resist coating on the patterned surface of the stamp against the surface of the substrate;
    curing the first patterned part of the resist coating; and
    demolding the first patterned part of the resist coating from the stamp by separating the stamp from the first patterned part of the resist coating.

2. The method according to claim 1, wherein the steps of embossing and separating are performed more than once to successively reduce a thickness of the first patterned part.

3. The method according to claim 1, further comprising coating the carrier with the flowable resist prior to embossing.

4. The method according to claim 1, further comprising wetting the first patterned part of the resist coating with a solvent after separating the stamp and the carrier.

5. The method according to claim 1, further comprising spinning the stamp with the first patterned part of the resist coating after separating the stamp and the carrier.

6. The method according to claim 1, wherein curing comprises curing the first patterned part of the resist coating by means of ultraviolet light.

7. The method according to claim 1, wherein the steps of curing the first patterned part of the resist coating and transferring the patterned resist are carried out simultaneously or overlapping in time.

8. The method according to claim 1, wherein the material of the substrate is selected from the group consisting of at least one semiconductor, at least one dielectric, and at least one metal and combinations thereof.

9. The method according to claim 8, wherein the at least one semiconductor is at least one of silicon, GaAs or InP and the at least one dielectric is quartz glass.

10. The method according to claim 1, wherein the flowable resist is at least one of a polymer, a monomer, a purely organic monomer, an organic composite monomer and an inorganic composite monomer.

11. The method according to claim 1, wherein the stamp is flexible.

12. The method according to claim 1, wherein the stamp is made from a polymer.

13. The method according to claim 1, wherein at least one of the carrier and the stamp are configured as one of a roll and a conveyor belt.

14. The method according to claim 13, wherein the carrier and the stamp are configured as a roll or conveyor belt, and the at least one embossing step with the associated separation step, the pressing step and the demolding step are carried out in a continuous roll-after-roll process.

15. The method according to claim 1, wherein opposite surfaces of the substrate are simultaneously subjected to the transferring step.

16. The method according to claim 1, wherein the surface of the substrate coated with the patterned resist surface is etched and optionally doped in one of an etching step and an optional doping step following the demolding step.

17. The method according to claim 1, wherein the cured resist coating forms a mask.

18. The method according to claim 1, wherein, upon separating the stamp from the carrier, a thickness of the first patterned part of the resist coating is less than a thickness of the resist coating prior to the separating step.

19. A method for applying a patterned coating of resist onto a surface of a substrate, comprising the steps of:
    embossing a resist coating of flowable resist at least once, between a stamp having a patterned surface comprising recesses and a carrier so as to provide the patterned surface with a patterned resist coating wherein patterned resist extends into the recesses;
    separating the stamp carrying a first patterned part of the resist coating that forms a continuous layer on the patterned surface of the stamp and the carrier carrying a second part of the resist coating from each other,
    wherein the steps of embossing and separating are performed more than once to successively reduce a thickness of the first patterned part;
    spinning the stamp with the first patterned part of the resist coating after separating the stamp and the carrier;
    transferring the first patterned part of the resist coating onto a surface of a substrate by pressing the first patterned part of the resist coating on the patterned surface of the stamp against the surface of the substrate;
    curing the first patterned part of the resist coating; and
    demolding the first patterned part of the resist coating from the stamp by separating the stamp from the first patterned part of the resist coating.

20. A method for applying a patterned coating of resist onto a surface of a substrate, comprising the steps of:
    embossing a resist coating of flowable resist at least once, between a stamp having a patterned surface comprising recesses and a carrier so as to provide the patterned surface with a patterned resist coating wherein patterned resist extends into the recesses;
    separating the stamp carrying a first patterned part of the resist coating that forms a continuous layer on the patterned surface of the stamp and the carrier carrying a second part of the resist coating from each other,
    wherein the steps of embossing and separating are performed more than once to successively reduce a thickness of the first patterned part;

transferring the first patterned part of the resist coating onto a surface of a substrate by pressing the first patterned part of the resist coating on the patterned surface of the stamp against the surface of the substrate;
curing the first patterned part of the resist coating,
wherein the steps of curing the first patterned part of the resist coating and transferring the patterned resist are carried out simultaneously or overlapping in time; and
demolding the first patterned part of the resist coating from the stamp by separating the stamp from the first patterned part of the resist coating.

* * * * *